(12) United States Patent
Yasui et al.

(10) Patent No.: US 12,230,474 B2
(45) Date of Patent: Feb. 18, 2025

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Takeshi Yasui, Toyama (JP); Tetsuaki Inada, Toyama (JP); Masaki Murobayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 209 days.

(21) Appl. No.: 17/576,216

(22) Filed: Jan. 14, 2022

(65) Prior Publication Data

US 2022/0230846 A1   Jul. 21, 2022

(30) Foreign Application Priority Data

Jan. 18, 2021   (JP) .................................. 2021-005770

(51) Int. Cl.
*H01J 37/32*   (2006.01)
*C23C 16/52*   (2006.01)
(Continued)

(52) U.S. Cl.
CPC ............ *H01J 37/321* (2013.01); *C23C 16/52* (2013.01); *H01J 37/32091* (2013.01);
(Continued)

(58) Field of Classification Search
CPC ............... H01J 37/321; H01J 37/32091; H01J 37/3244; H01J 37/32577; H01J 37/3211;
(Continued)

(56) References Cited

U.S. PATENT DOCUMENTS 11,538,661 B1 * 12/2022 Yoshino ................ H01J 37/321
2020/0219699 A1   7/2020 Yasui et al.
(Continued)

FOREIGN PATENT DOCUMENTS

| JP | 2016-018727 A | 2/2016 |
| KR | 10-2073533 B1 | 2/2020 |
| WO | 2019/082569 A1 | 5/2019 |

OTHER PUBLICATIONS

Japanese Office Action issued on Sep. 13, 2022 for Japanese Patent Application No. 2021-005770.
(Continued)

*Primary Examiner* — Jeffrie R Lund
(74) *Attorney, Agent, or Firm* — Volpe Koenig

(57) ABSTRACT

There is included a process container; a gas supply system; and a coil provided with a section between a first grounding point and a second grounding point of the coil so as to be spirally wound a plurality of times along an outer periphery of the process container, wherein the coil is configured so that a coil separation distance, which is a distance from an inner periphery of the coil to an inner periphery of the process container, in a partial section of a first winding section, which is a section where the coil winds once along the outer periphery of the process container in a direction from the first grounding point toward the second grounding point, is longer than a coil separation distance in another partial section of the first winding section continuous with the partial section of the first winding section.

19 Claims, 11 Drawing Sheets

(51) Int. Cl.
*H01L 21/308* (2006.01)
*H01L 21/67* (2006.01)
(52) U.S. Cl.
CPC ........ *H01J 37/3244* (2013.01); *H01L 21/308* (2013.01); *H01L 21/67069* (2013.01)
(58) Field of Classification Search
CPC .......... H01J 37/32669; H01J 37/32623; H01J 37/32715; H01J 37/32743; C23C 16/52; C23C 16/40; H01L 21/308; H01L 21/67069
See application file for complete search history.

(56) References Cited

U.S. PATENT DOCUMENTS

| | | | |
|---|---|---|---|
| 2022/0230846 A1* | 7/2022 | Yasui | C23C 16/52 |
| 2023/0139945 A1* | 5/2023 | Yoshino | H01J 37/32128 |
| | | | 315/111.21 |
| 2024/0087927 A1* | 3/2024 | Harada | H01L 21/02274 |
| 2024/0321558 A1* | 9/2024 | Yasui | H01J 37/32513 |

OTHER PUBLICATIONS

Taiwan Office Action issued on Sep. 26, 2022 for Taiwan Patent Application No. 110142911.
Singapore Search Report issued on May 30, 2023 for Singapore Patent Application No. 10202200435P.
Singapore Written Opinion issued on May 30, 2023 for Singapore Patent Application No. 10202200435P.
Korean Office Action issued on Dec. 22, 2023 for Korean Patent Application No. 10-2022-0006507.

* cited by examiner

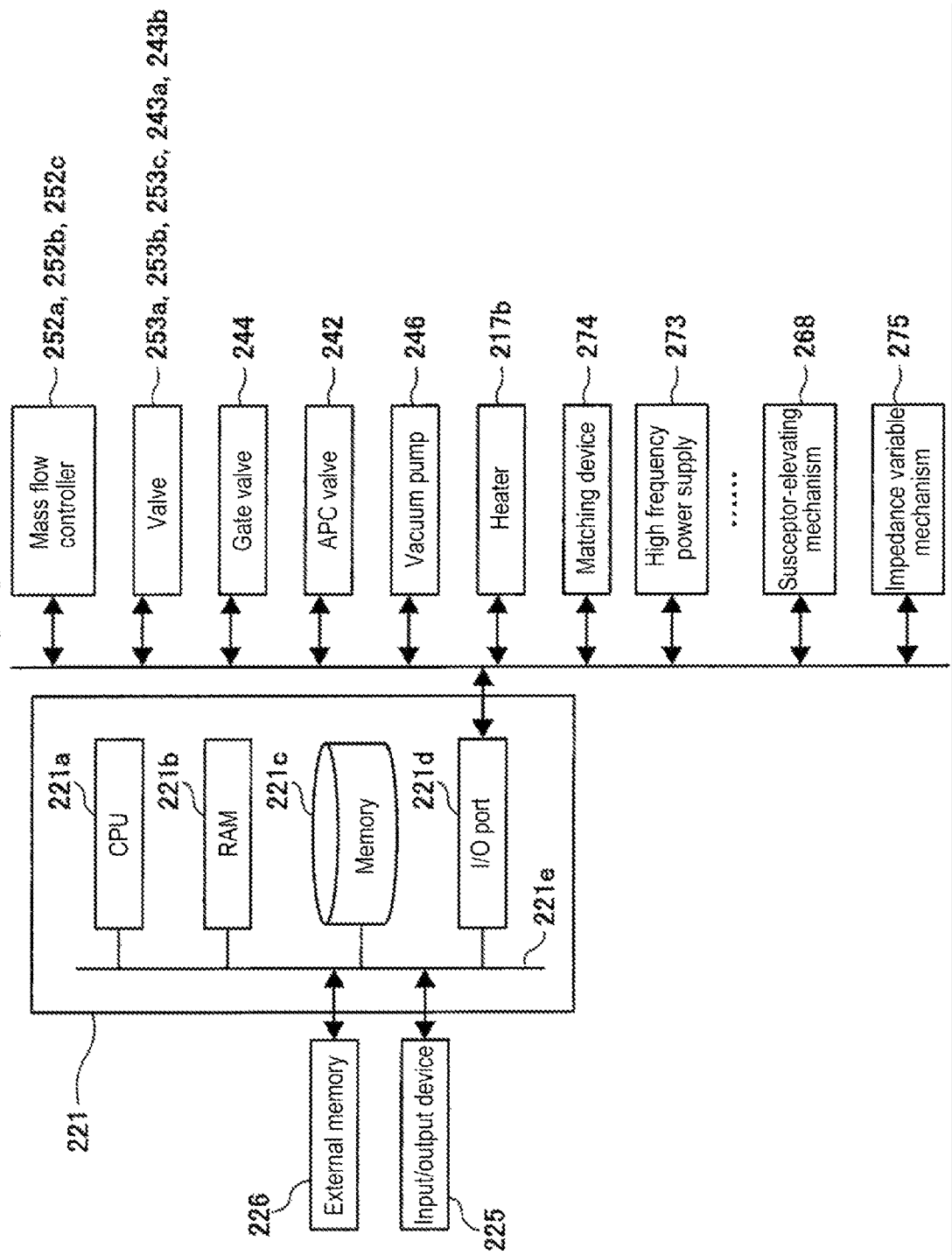

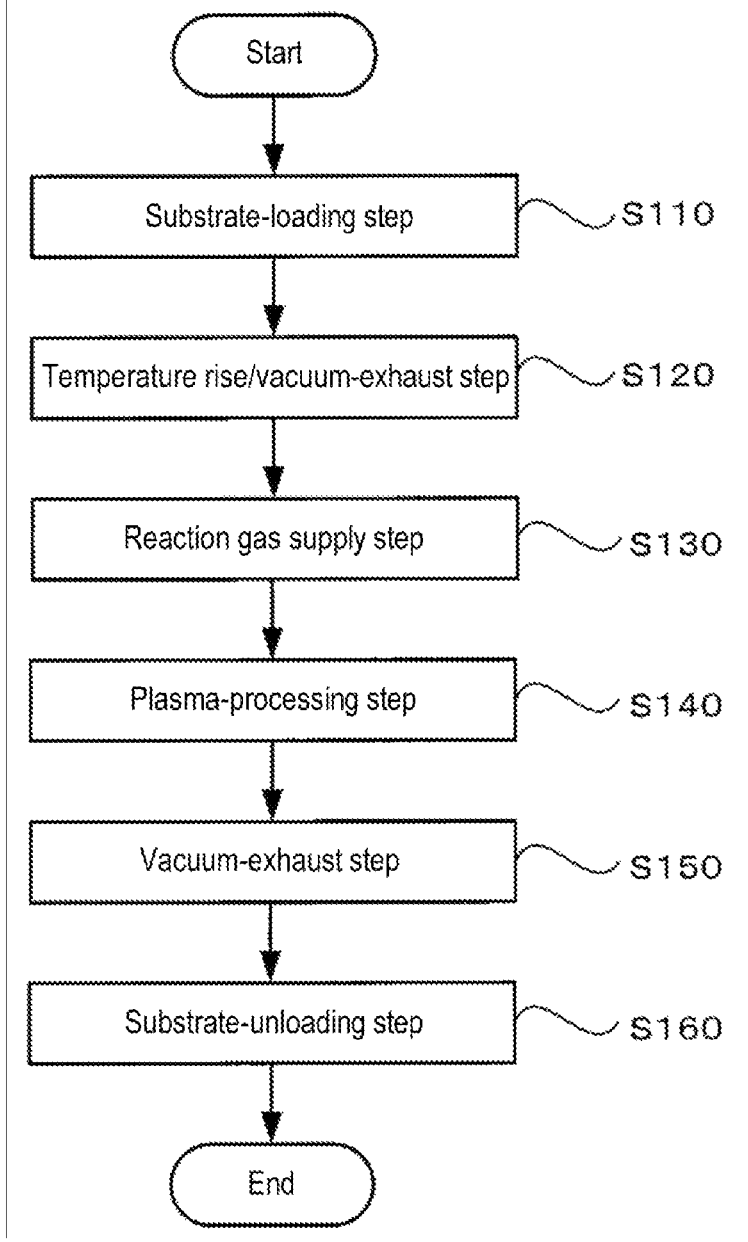

FIG. 12

|  | Sample 1 | Sample 2 |
|---|---|---|
| Average film thickness [nm] | 13.1 | 13.2 |
| In-plane uniformity [±%] | 1.6 | 4.0 |

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION(S)

This application is based upon and claims the benefit of priority from Japanese Patent Application No. 2021-005770, filed on Jan. 18, 2021, the entire contents of which are incorporated herein by reference.

TECHNICAL FIELD

The present disclosure relates to a substrate processing apparatus, a method of manufacturing a semiconductor device, and a recording medium.

BACKGROUND

In the related art, a substrate processing apparatus for processing a substrate with a process gas plasma-excited by supplying high frequency power to a coil is known.

SUMMARY

However, in the substrate processing apparatus as mentioned above, the plasma density in the in-plane direction of the substrate may be biased in the vicinity of a grounding point on the coil, which may cause deterioration of the in-plane uniformity of substrate processing.

Some embodiments of the present disclosure provide a technique capable of improving the in-plane uniformity of substrate processing.

According to one or more embodiments of the present disclosure, there is provided a technique that includes a process container in which a process gas is plasma-excited; a gas supply system configured to supply the process gas into the process container; and a coil provided with a section between a first grounding point and a second grounding point of the coil so as to be spirally wound a plurality of times along an outer periphery of the process container, the coil being configured to supply high frequency power, wherein the coil is configured so that a coil separation distance, which is a distance from an inner periphery of the coil to an inner periphery of the process container, in a partial section of a first winding section, which is a section where the coil winds once along the outer periphery of the process container in a direction from the first grounding point toward the second grounding point, is longer than a coil separation distance in another partial section of the first winding section continuous with the partial section of the first winding section, and wherein the partial section of the first winding section includes the first grounding point.

BRIEF DESCRIPTION OF DRAWINGS

The accompanying drawings, which are incorporated in and constitute a part of the specification, illustrate embodiments of the present disclosure.

FIG. 6 is a diagram showing the configuration of a control part (control means) of the substrate processing apparatus suitably used in the embodiments of the present disclosure.

FIG. 7 is a flow chart showing a substrate-processing process suitably used in the embodiments of the present disclosure.

FIG. 12 is a diagram showing the average film thickness and the in-plane uniformity of a film formed on a substrate when the substrate is processed by using a resonance coil according to an example and a resonance coil according to a comparative example.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One or More Embodiments of the Present Disclosure>

One or more embodiments of the present disclosure will be now described with reference to FIGS. 1 to 7. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
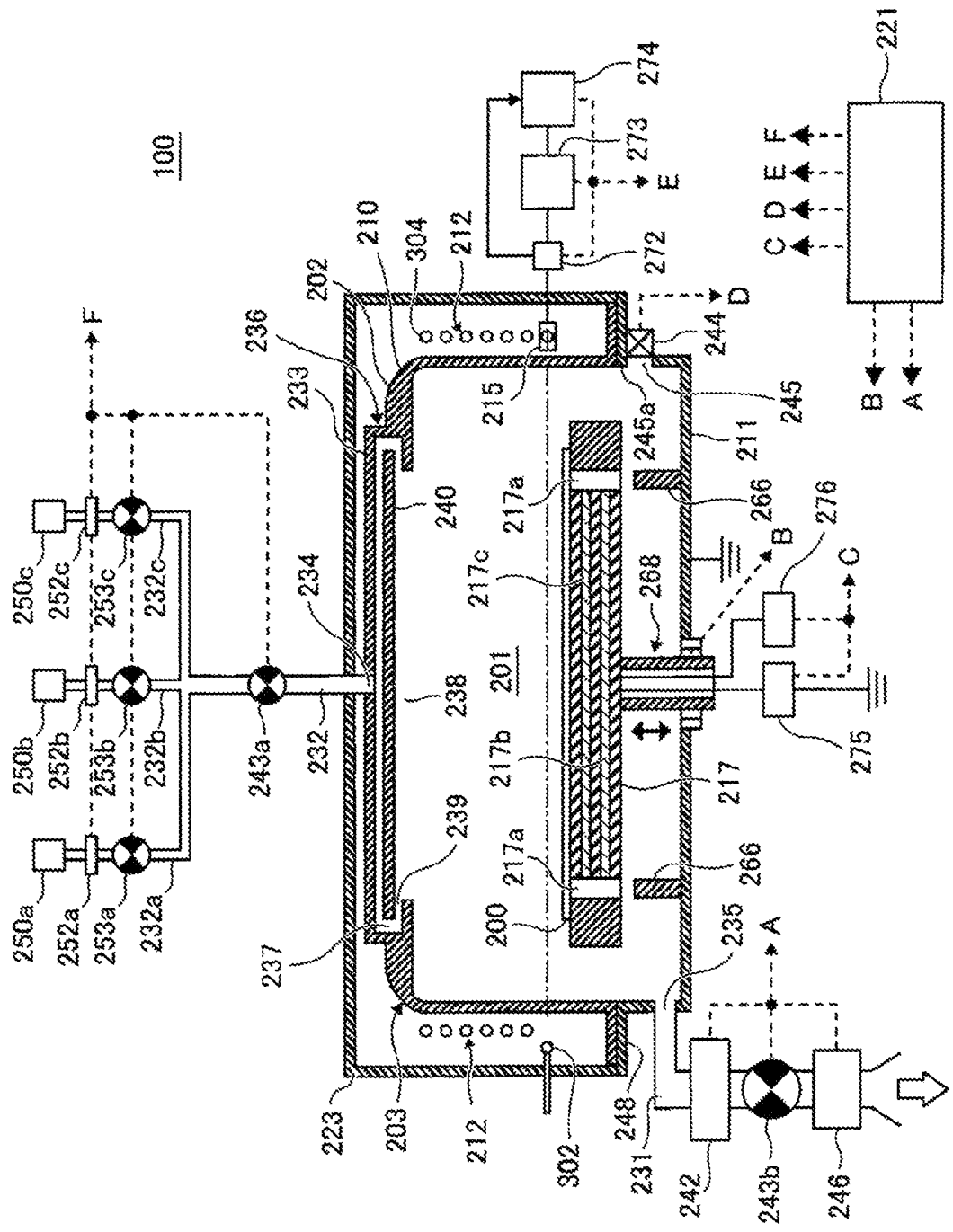
FIG. 1 is a schematic configuration view of a substrate processing apparatus suitably used in the embodiments of the present disclosure.

A substrate processing apparatus 100 according to one or more embodiments of the present disclosure will be described below with reference to FIG. 1. The substrate processing apparatus according to the embodiments of the present disclosure is configured to mainly perform an oxidizing process to a film or a base formed on a substrate surface.

(Process Chamber)

The substrate processing apparatus 100 includes a process furnace 202 that processes a wafer 200 as a substrate by using plasma. A process container 203 that constitutes a process chamber 201 is provided in the process furnace 202. The process container 203 includes a dome-shaped upper container 210, which is a first container, and a bowl-shaped lower container 211, which is a second container. The process chamber 201 is formed by covering the upper container 210 on the lower container 211. The upper container 210 is made of quartz. Further, the upper container 210 constitutes a plasma container that forms a plasma generation space in which a process gas is plasma-excited.

A gate valve 244 is provided on a lower sidewall of the lower container 211. When the gate valve 244 is opened, the wafer 200 can be loaded/unloaded in/out of the process chamber 201 via a loading/unloading port 245 by using a transfer mechanism. The gate valve 244 is configured to be a gate valve that maintains airtightness in the process chamber 201 when it is closed.

The process chamber 201 has a plasma generation space provided with a resonance coil 212, which is a coil as an electrode, around the process chamber 201, and a substrate-processing space communicating with the plasma generation space, as a substrate process chamber in which the wafer 200 is processed. The plasma generation space is a space in which plasma is generated, and refers to a space in the process chamber 201 above the lower end of the coil 212 and below the upper end of the resonance coil 212. On the other hand, the substrate-processing space is a space in which the substrate is processed by using plasma, and refers to a space below the lower end of the resonance coil 212. In one or more embodiments of the present disclosure, the diameters of the plasma generation space and the substrate-processing space in the horizontal direction are substantially the same.

(Susceptor)

A susceptor 217 as a substrate-mounting table on which the wafer 200 is mounted is disposed at the center of the bottom side of the process chamber 201. The susceptor 217 is provided below the resonance coil 212 in the process chamber 201.

A heater 217b as a heating mechanism is integrally embedded inside the susceptor 217. The heater 217b is configured to be able to heat the wafer 200 when electric power is supplied to the heater 217b.

The susceptor 217 is electrically insulated from the lower container 211. In order to further improve the uniformity of the density of plasma generated on the wafer 200 mounted on the susceptor 217, an impedance adjustment electrode 217c is provided inside the susceptor 217 and is grounded via an impedance variable mechanism 275 as an impedance adjustment part.

The susceptor 217 is provided with a susceptor-elevating mechanism 268 including a drive mechanism for raising and lowering the susceptor 217. Further, the susceptor 217 is provided with through-holes 217a, and wafer push-up pins 266 are provided on the bottom surface of the lower container 211. When the susceptor 217 is lowered by the susceptor-elevating mechanism 268, the wafer push-up pins 266 penetrate through the through-holes 217a in a state where the wafer push-up pins 266 is in non-contact with the susceptor 217.

(Gas Supply Part)

A gas supply head 236 is provided above the process chamber 201, that is, in the upper portion of the upper container 210. The gas supply head 236 includes a cap-shaped lid 233, a gas introduction port 234, a buffer chamber 237, an opening 238, a shielding plate 240, and a gas ejection port 239 and is configured to be able to supply a reaction gas into the process chamber 201. The buffer chamber 237 has a function as a dispersion space for dispersing the reaction gas introduced from the gas introduction port 234.

The downstream end of an oxygen-containing gas supply pipe 232a for supplying an oxygen-containing gas, the downstream end of a hydrogen-containing gas supply pipe 232b for supplying a hydrogen-containing gas, and an inert gas supply pipe 232c for supplying an inert gas are connected to the gas introduction port 234 so that they merge with each other. The oxygen-containing gas supply pipe 232a is provided with an oxygen-containing gas supply source 250a, a mass flow controller (MFC) 252a as a flow control device, and a valve 253a as an opening/closing valve, sequentially from the upstream side. The hydrogen-containing gas supply pipe 232b is provided with a hydrogen-containing gas supply source 250b, a MFC 252b, and a valve 253b, sequentially from the upstream side. The inert gas supply pipe 232c is provided with an inert gas supply source 250c, a MFC 252c, and a valve 253c, sequentially from the upstream side. A valve 243a is provided on the downstream side where the oxygen-containing gas supply pipe 232a, the hydrogen-containing gas supply pipe 232b, and the inert gas supply pipe 232c merge with each other, and is connected to the upstream end of the gas introduction port 234. The valves 253a, 253b, 253c, and 243a are opened/closed to allow process gases such as the oxygen-containing gas, the hydrogen-containing gas, and the inert gas to be supplied into the process chamber 201 via the gas supply pipes 232a, 232b, and 232c while adjusting the flow rate of the gases by the MFCs 252a, 252b, and 252c, respectively.

A gas supply part (gas supply system) according to one or more embodiments of the present disclosure mainly includes the gas supply head 236, the oxygen-containing gas supply pipe 232a, the hydrogen-containing gas supply pipe 232b, the inert gas supply pipe 232c, the MFCs 252a, 252b, and 252c, and the valves 253a, 253b, 253c, and 243a. The gas supply part (the gas supply system) is configured to supply the process gases into the process container 203.

Further, an oxygen-containing gas supply system according to one or more embodiments of the present disclosure includes the gas supply head 236, the oxygen-containing gas supply pipe 232a, the MFC 252a, and the valves 253a and 243a. Further, a hydrogen-containing gas supply system according to one or more embodiments of the present disclosure includes the gas supply head 236, the hydrogen-containing gas supply pipe 232b, the MFC 252b, and the valves 253b and 243a. Further, an inert gas supply system according to one or more embodiments of the present disclosure includes the gas supply head 236, the inert gas supply pipe 232c, the MFC 252c, and the valves 253c and 243a.

(Exhaust Part)

A gas exhaust port 235 for exhausting a reaction gas from the interior of the process chamber 201 is provided on the side wall of the lower container 211. The upstream end of a gas exhaust pipe 231 is connected to the gas exhaust port 235. The gas exhaust pipe 231 is provided with an auto pressure controller (APC) valve 242 as a pressure regulator (a pressure adjustment part), a valve 243b as an opening/closing valve, and a vacuum pump 246 as a vacuum exhaust device, sequentially from the upstream side. An exhaust part according to one or more embodiments of the present disclosure mainly includes the gas exhaust port 235, the gas exhaust pipe 231, the APC valve 242, and the valve 243b. The vacuum pump 246 may be included in the exhaust part.

(Plasma Generation Part)

The resonance coil 212 is provided on the outer peripheral portion of the process chamber 201, that is, on the outer side of the sidewall of the upper container 210, so as to be spirally wound a plurality of times along the outer periphery of the upper container 210. A RF sensor 272, a high frequency power supply 273, and a matching device 274 that matches the impedance and output frequency of the high frequency power supply 273, are connected to the resonance coil 212.

The high frequency power supply 273 supplies high frequency power (RF power) to the resonance coil 212. The RF sensor 272 is provided on the output side of the high frequency power supply 273 and monitors information of a traveling wave and a reflected wave of the supplied high frequency. The reflected wave power monitored by the RF sensor 272 is input to the matching device 274, and the matching device 274 controls the frequency of the output high frequency power and the impedance of the high frequency power supply 273 so as to minimize the reflected wave, based on the information of the reflected wave input from the RF sensor 272.

The high frequency power supply 273 includes a power supply control means (control circuit) including a high frequency oscillation circuit and a preamplifier for defining an oscillation frequency and an output, and an amplifier (output circuit) for amplifying the output of the control circuit to a predetermined output. The power supply control means controls the amplifier based on a preset frequency and power output conditions through a control panel. The amplifier supplies constant high frequency power to the resonance coil 212 via a transmission line.

The winding diameter, the winding pitch, and the number of turns are set for the resonance coil 212 so as to be resonated at a constant wavelength in order to form a standing wave having a predetermined wavelength. That is, the electrical length of the resonance coil 212 is set to a length corresponding to an integral multiple (1 times, 2 times, . . . ) of one wavelength at a predetermined frequency of the high frequency power supplied from the high frequency power supply 273.

Specifically, in consideration of applied power, a generated magnetic field strength, the outer shape of an applied device, and the like, the resonance coil 212 has the effective sectional area of 50 to 300 mm$^2$ and the coil diameter of 200 to 500 mm so as to generate a magnetic field of about 0.01 to 10 Gauss with high frequency power of, for example, 800 kHz to 50 MHz and 0.1 to 5 KW, and is wound about 2 to 60 times on the outer peripheral side of a container forming the plasma generation space.

As a material of which the resonance coil 212 is made, a copper pipe, a copper thin plate, an aluminum pipe, an aluminum thin plate, a material in which copper or aluminum is vapor-deposited on a polymer belt, etc. are used. The resonance coil 212 is formed in a flat plate shape with an insulating material, and is supported by a plurality of supports (not shown) vertically erected on the upper end surface of a base plate 248.

Both ends of the resonance coil 212 are electrically grounded. One of both ends of the resonance coil 212 is grounded at a first grounding point 302 as a fixed ground. Further, the other end of the resonance coil 212 is grounded at a second grounding point 304. The second grounding point 304 may be grounded via a movable tap in order to finely tune the electrical length of the resonance coil. Further, in order to finely tune the impedance of the resonance coil 212 at the time of initial installation of the device or at the time of changing the process conditions, a power feeding part is configured by a movable tap 215 between the grounded ends of the resonance coil 212. Further, the position of the movable tap 215 is adjusted so that the resonance characteristic of the resonance coil 212 is substantially equal to that of the high frequency power supply 273. Since the resonance coil 212 includes the variable ground portion and the variable power feeding part, the resonance frequency and the load impedance of the process chamber 201 can be adjusted more easily, as will be described later.

A shielding panel 223 is provided to shield an electric field outside the resonance coil 212 and to form a capacitance component (C component) necessary for forming a resonance circuit between the shielding panel 223 and the resonance coil 212. The shielding panel 223 is generally made of a conductive material such as an aluminum alloy and is formed in a cylindrical shape. The shielding panel 223 is arranged at a distance of about 5 to 150 mm from the outer periphery of the resonance coil 212.

A plasma generation part according to one or more embodiments of the present disclosure mainly includes the resonance coil 212, the RF sensor 272, and the matching device 274. The high frequency power supply 273 may be included as the plasma generation part.

Here, the plasma generation principle and the properties of the generated plasma of the apparatus according to one or more embodiments of the present disclosure will be described in detail. A plasma generation circuit composed of the resonance coil 212 is configured as an RLC parallel resonance circuit. When the wavelength of the high frequency power supplied from the high frequency power supply 273 is equal to the electrical length of the resonance coil 212, the reactance condition of the resonance coil 212 is that reactance components created by the capacitive component and the inductive component of the resonance coil 212 are cancelled out to become a pure resistance. However, in the above plasma generation circuit, when plasma is generated, the actual resonance frequency fluctuates slightly depending on a fluctuation in a capacitive coupling between a voltage part of the resonance coil 212 and the plasma, a fluctuation in an inductive coupling between the plasma generation space and the plasma, an excitation state of the plasma, and the like.

Therefore, in order to compensate a deviation of resonance in the resonance coil 212 on the power supply side when the plasma is generated, one or more embodiments of the present disclosure provide a function of detecting, by the RF sensor 272, the reflected wave power from the resonance coil 212 when the plasma is generated, and correcting, by the matching device 274, the output of the high frequency power supply 273 based on the reflected wave power.

Specifically, the matching device 274 increases or decreases the impedance or output frequency of the high frequency power supply 273 so as to minimize the reflected wave power based on the reflected wave power from the resonance coil 212 when the plasma detected by the RF sensor 272 is generated. When controlling the impedance, the matching device 274 is configured by a variable capacitor control circuit that corrects the preset impedance, and when controlling the frequency, the matching device 274 is configured by a frequency control circuit that corrects the preset oscillation frequency of the high frequency power supply 273. Further, the high frequency power supply 273 and the matching device 274 may be integrally configured.

With this configuration, since the resonance coil 212 in one or more embodiments of the present disclosure is supplied with high frequency power at the actual resonance frequency of the resonance coil including plasma (or is supplied with the high frequency power so as to match with the actual impedance of the resonance coil including plasma), a standing wave is formed in which a phase voltage and an anti-phase voltage are always cancelled out. When the electrical length of the resonance coil 212 is equal to the wavelength of the high frequency power, the highest phase current is generated at the electrical midpoint (node of zero voltage) of the coil. Therefore, in the vicinity of the electrical midpoint, since there is almost no capacitive coupling with the process chamber wall or the susceptor 217, donut-shaped inductive plasma having an extremely low electrical potential is formed.

(Winding Diameter of Resonance Coil)

Next, the winding diameter of the resonance coil 212 in one or more embodiments of the present disclosure will be described. As described above, the lower end of the resonance coil 212 is grounded at the first grounding point 302, and the upper end of the resonance coil 212 is grounded at the second grounding point 304. That is, both ends of the resonance coil 212 are grounded at the first grounding point 302 and the second grounding point 304, respectively, and the first grounding point 302 is provided below the second grounding point 304. The resonance coil 212 is configured so that a section between the first grounding point 302 and the second grounding point 304 is provided to be spirally wound a plurality of times along the outer periphery of the process container 203 in order to supply the high frequency power. Here, "along the outer periphery of the process container 203" means that the resonance coil 212 and the outer periphery (outer surface or outer wall) of the process container 203 are close to each other to such an extent that a high frequency electromagnetic field generated by the resonance coil 212 substantially plasma-excites the process gas in the process container 203.

<Winding Diameter of Resonance Coil According to Comparative Example>

First, in the substrate processing apparatus 100, an example in which a resonance coil 412 according to a comparative example is used instead of the resonance coil 212 in one or more embodiments of the present disclosure will be described with reference to FIGS. 2A, 2B, 3A, and 3B.

Figure 2A:
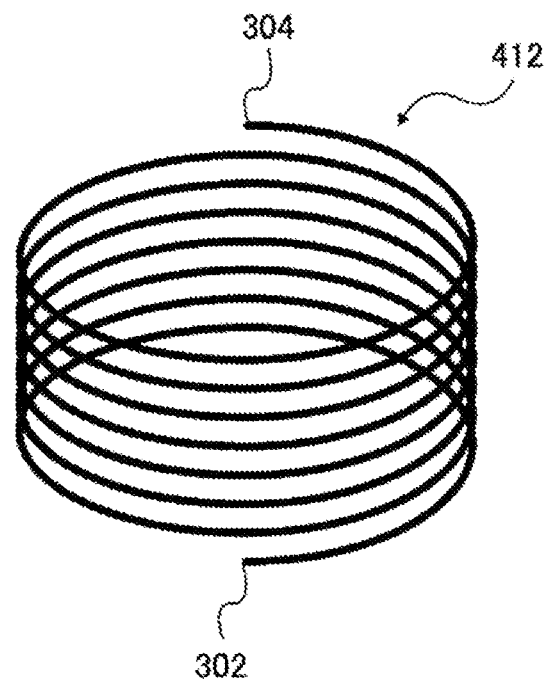
FIG. 2A is a view showing a resonance coil according to a comparative example of the present disclosure.

As shown in FIG. 2A, the resonance coil 412 according to the comparative example has the constant and same winding diameter at any position on the resonance coil 412. That is, when a distance from the inner wall surface (the surface of the inner periphery) of the upper container 210 to the inner diameter side surface (the surface on the side facing the side wall of the upper container 210, that is, the inner peripheral surface) of the resonance coil 412 (hereinafter, a coil separation distance) is defined as d1, in this comparative example, d1 is always constant and the winding diameter is the same.

The configuration of this comparative example is the same as that of the resonance coil 212 in one or more embodiments of the present disclosure except for the winding diameter. Also in this comparative example, a power feeding point is provided on a line of the resonance coil 412, and high frequency power is supplied from the high frequency power supply 273 to form a standing wave of a current and a voltage having a length of, for example, one wavelength of high frequency power in the section between the first grounding point 302 and the second grounding point 304 on the line of the resonance coil 412. Of the waveforms on the left side of FIG. 2B, a broken line indicates a current and a solid line indicates a voltage. As shown by the waveforms on the left side of FIG. 2B, the amplitude of the standing wave of the current becomes maximum at the first grounding point 302, the second grounding point 304, and the midpoint therebetween (that is, the electrical midpoint) of the resonance coil 412.

Figure 3A:
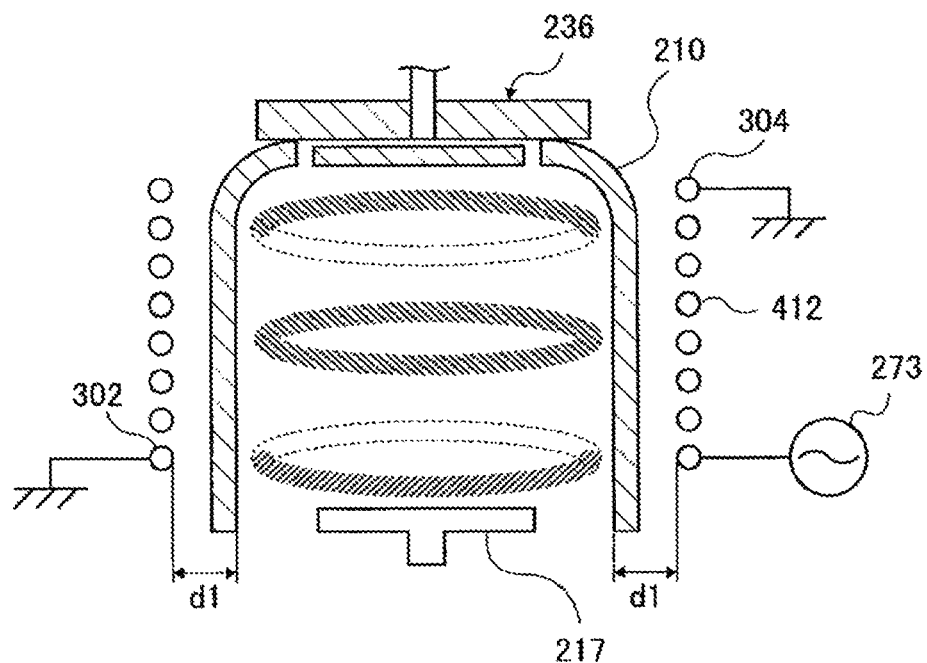
FIG. 3A is a view showing a state inside a process furnace when a process gas is plasma-excited by using the resonance coil of FIG. 2A.

A high frequency magnetic field is formed in the vicinity of the midpoint of the resonance coil 412 where the current amplitude becomes maximum, and a high frequency electromagnetic field induced by this high frequency magnetic field generates discharge of a process gas supplied into the plasma generation space in the upper container 210. When the process gas is excited by this discharge, plasma of the process gas is generated in the vicinity of the midpoint of the resonance coil 412. Hereinafter, the plasma of the process gas generated by the high frequency electromagnetic field formed in the vicinity of a position (region) where the current amplitude is large is referred to as inductively coupled plasma (ICP). As shown in FIG. 3A, the ICP is generated in a donut shape in a region of the space along the inner wall surface in the upper container 210 near the midpoint of the resonance coil 412, thereby generating an ICP with a uniform plasma density in the in-plane direction of the wafer 200.

Figure 2B:
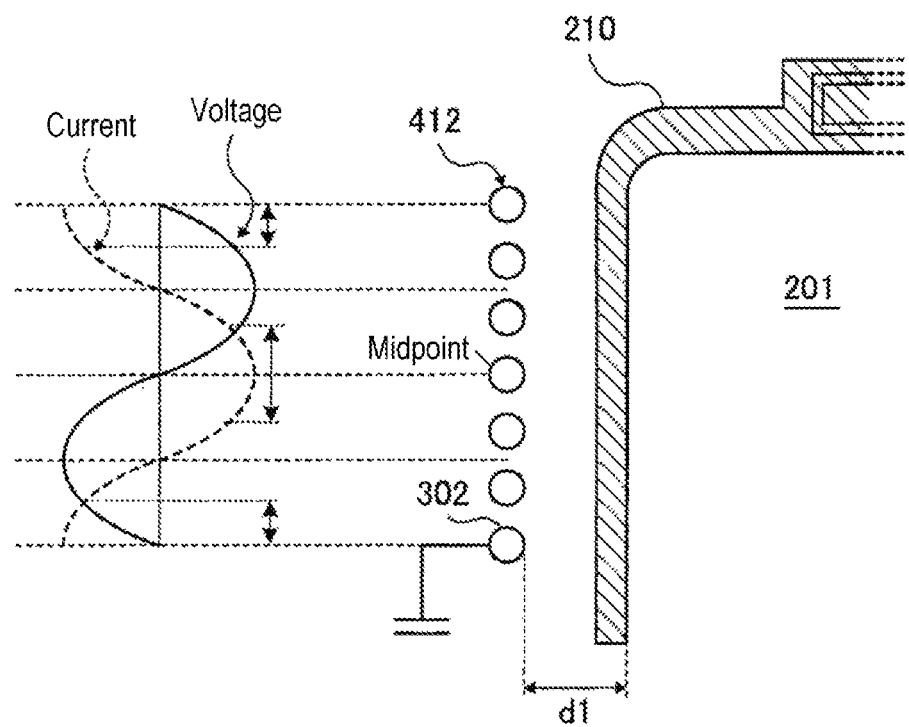
FIG. 2B is an explanatory view showing a relationship between a current and a voltage in the resonance coil of FIG. 2A.
Figure 3B:
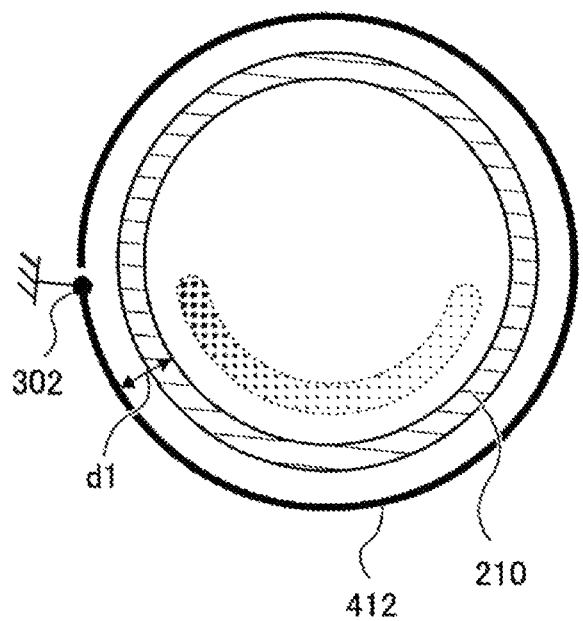
FIG. 3B is a horizontal sectional view at the lower end of the resonance coil of FIG. 3A.

Here, as shown in FIGS. 2A and 2B, in the vicinity of the first grounding point 302 on the lower end side of the resonance coil 412 and even in the vicinity of the second grounding point 304 on the upper end side of the resonance coil 412, the amplitude of the current (magnetic field) becomes maximum to form a high frequency electromagnetic field. However, a section having a large current amplitude (for example, a section having 80% or more of the maximum amplitude) on each of the upper end side and the lower end side of the resonance coil 412 is narrower than a section having a large current amplitude (for example, a section having 80% or more of the maximum amplitude) in the vicinity of the midpoint of the resonance coil 412. Specifically, for example, on the upper end side and the lower end side of the resonance coil 412, the length of the section where the current amplitude is 80% or more of the maximum amplitude may be about half of that in the vicinity of the midpoint of the resonance coil 412. In such a case, on the upper end side and the lower end side of the resonance coil 412, as shown in FIGS. 3A and 3B, an ICP having a high plasma density may not be generated to make one round in a donut shape along the inner periphery of the process container 203, but may be generated in a partial region in the inner peripheral direction of the process container 203. That is, the ICP having the high plasma density may be generated in a non-uniformly biased state in the inner peripheral direction of the process container 203.

Further, as shown in FIG. 2B, the distribution of plasma density of the ICP generated on each of the upper end side and the lower end side in the inner peripheral direction of the process container 203 becomes a distribution having a bias that significantly increases the plasma density at a position corresponding to the first grounding point 302 where the current amplitude becomes maximum and a position corresponding to the second grounding point 304 where the current amplitude becomes maximum. This is because the ICP generated in the vicinity of the midpoint is formed so that the distribution of plasma density is substantially uniform over the entire inner peripheral direction of the process container 203 with the midpoint as the center, whereas the ICP generated on each of the upper end side and the lower end side has the maximum plasma density in each of the vicinity of the first grounding point 302 and the vicinity of the second grounding point 304 and has a plasma density distribution in which the plasma density decreases rapidly as a distance increases from there in the inner peripheral direction of the process container 203 along the line of the resonance coil 412. Further, it is presumed that the formation of the ICP generated in the vicinity of the midpoint so that the plasma density distribution is substantially uniform over the entire inner peripheral direction of the process container 203 is caused by promotion of the formation of the ICP over the entire inner peripheral direction of the process container 203 as a region where the plasma density is high forms a continuous ring along the inner periphery of the process container 203.

That is, when the resonance coil 412 according to the comparative example is used, a grounding point of the resonance coil 412 becomes a singular point, and plasma generated by an induced current at the grounding point causes a bias in the distribution of the plasma density in the inner peripheral direction of the process container 203, which may deteriorate the in-plane uniformity of a film formed on the wafer 200. One of the reasons for this is that the plasma density in the circumferential direction becomes non-uniform because the winding diameter of the resonance coil is larger than the wavelength of high frequency power. In particular, it has been confirmed that when a value of the high frequency power supplied from the high frequency power supply 273 is set to 3,500 to 4,800 W, the deterioration of the in-plane uniformity becomes remarkable.

<Winding Diameter of Resonance Coil According to One or More Embodiments of the Present Disclosure>

Next, the resonance coil 212 in one or more embodiments of the present disclosure will be described with reference to FIGS. 4A, 4B, 5A, and 5B.

Figure 4A:
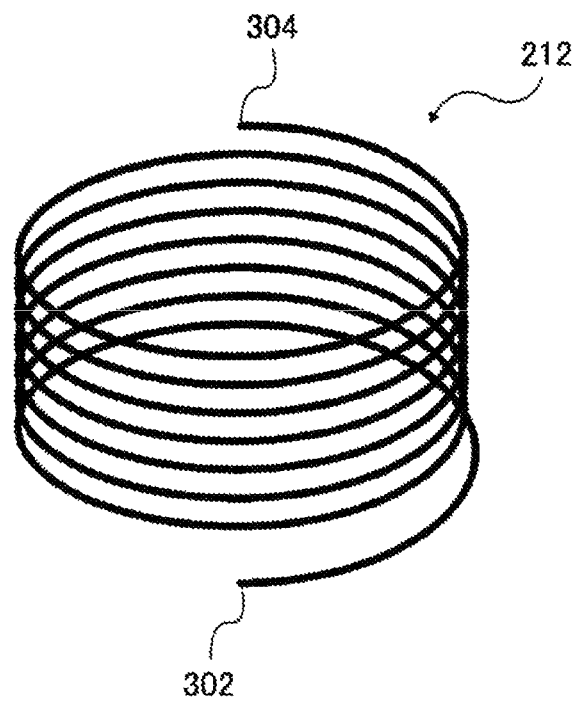
FIG. 4A is a view showing a resonance coil suitably used in the embodiments of the present disclosure.
Figure 4B:
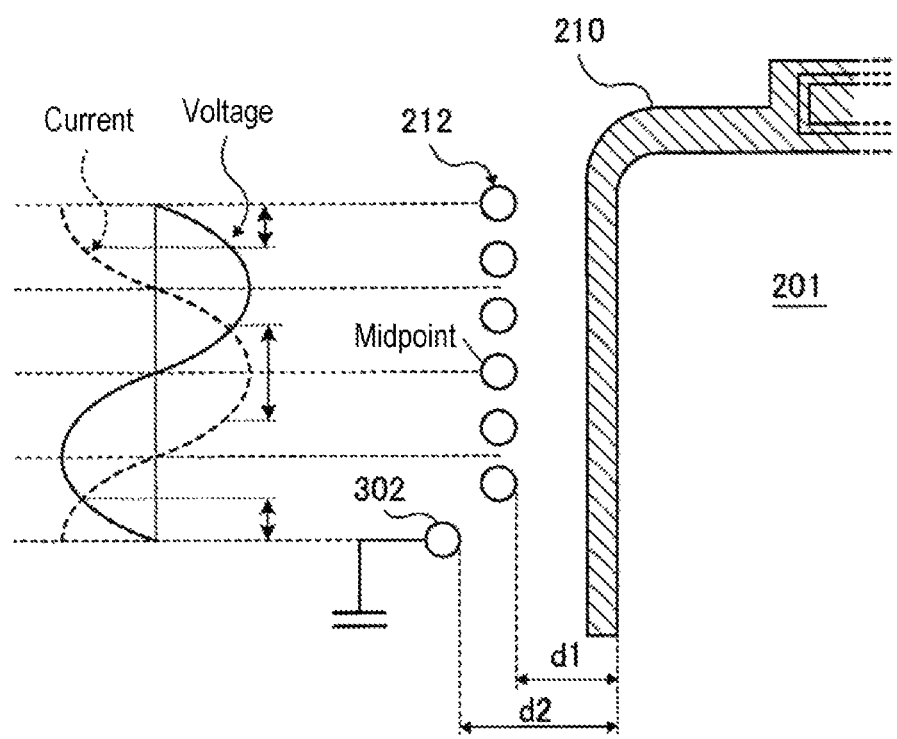
FIG. 4B is an explanatory view showing a relationship between a current and a voltage in the resonance coil of FIG. 4A.

In the resonance coil 212 in one or more embodiments of the present disclosure, as shown in FIGS. 4A and 4B, the winding diameter of the resonance coil 212 is extended at the first grounding point 302 on the lower end side of the resonance coil 212 so as to be different from section other than the first grounding point 302 on the line of the resonance coil 212. That is, when a distance from the inner wall surface (the inner peripheral surface) of the upper container 210 to the inner diameter side surface (the surface on the side facing the side wall of the upper container 210, that is, the inner peripheral surface) of the resonance coil 212, that is, a coil separation distance, which is a distance from the inner periphery of the resonance coil 212 at the midpoint of the resonance coil 212 to the inner periphery of the process container 203, is defined as d1, a coil separation distance at the first grounding point 302 of the resonance coil 212 is defined as d2 and is longer than d1. Here, the midpoint of the resonance coil 212 refers to substantially the center between the first grounding point 302 and the second grounding point 304 in the resonance coil 212.

Specifically, the resonance coil 212 has a first winding section, which is a section where the resonance coil 212 winds once along the outer periphery of the process container 203 in a direction from the first grounding point 302 toward the second grounding point 304. The first winding section is composed of a first section in which the coil separation distance is constant at d1, and a second section continuous with the first section, including the first grounding point 302, in which the coil separation distance is longer than d1. Further, the resonance coil 212 is configured such that the coil separation distance in the second section including the first grounding point 302 in the first winding section is longer than the coil separation distance in the first section. Further, the length of the second section is set to be shorter than half of the first winding section.

Figure 5A:
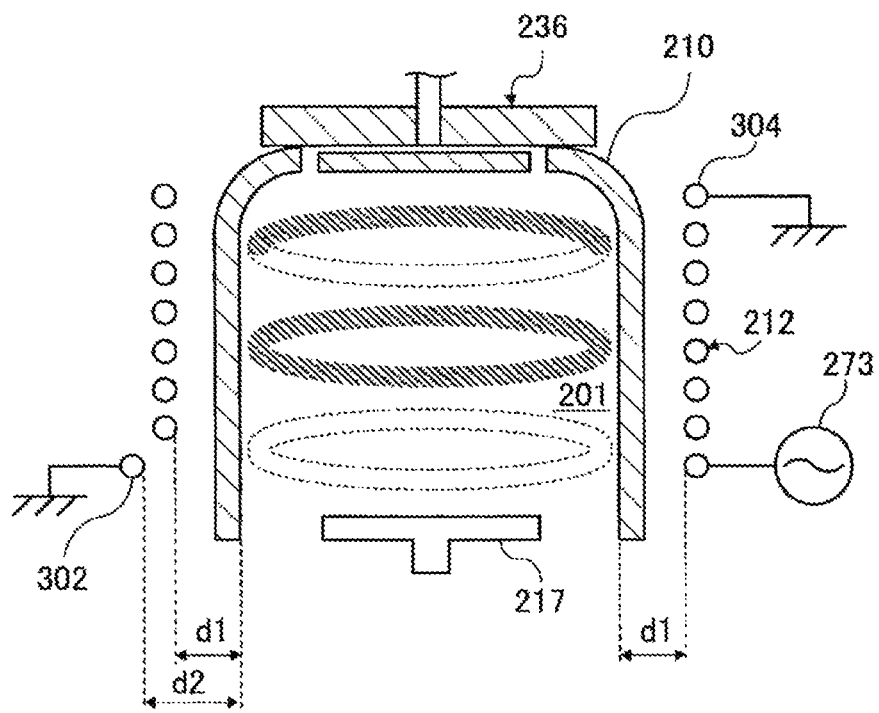
FIG. 5A is a view showing a state inside a process furnace when a process gas is plasma-excited by using the resonance coil of FIG. 4A.
Figure 5B:
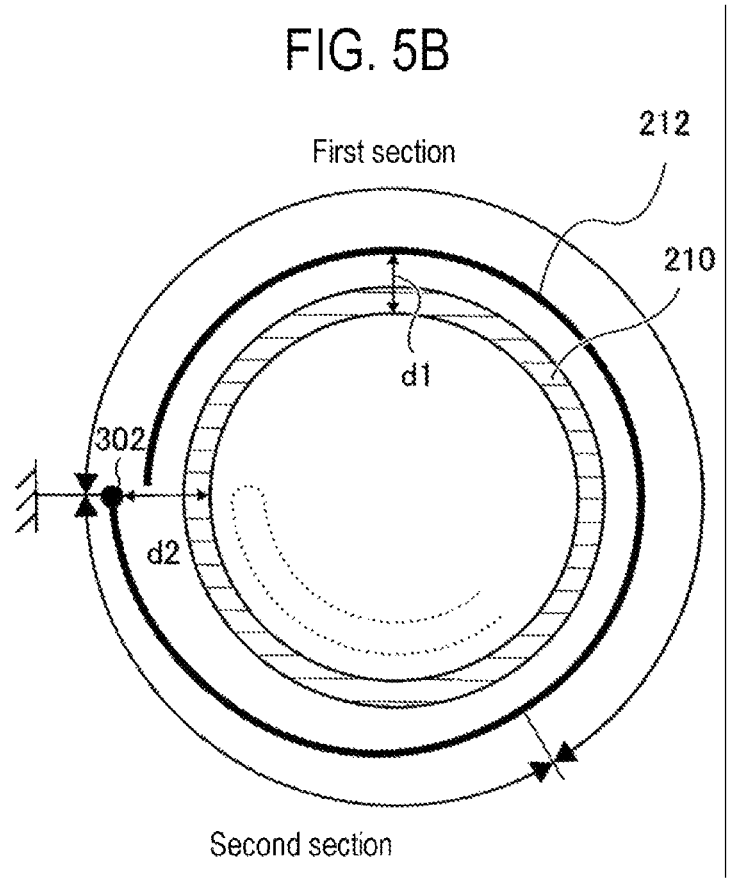
FIG. 5B is a horizontal sectional view at the lower end of the resonance coil of FIG. 5A.

As shown in FIGS. 5A and 5B, the coil separation distance d2 at the first grounding point 302 is set to be longer than the coil separation distance d1 in the other sections. That is, the resonance coil 212 is configured so that the coil separation distance d2 at the first grounding point 302 is the longest in the section between the first grounding point 302 and the second grounding point 304. Further, the resonance coil 212 is configured so that the coil separation distance d2 at the first grounding point 302 in the first winding section is the longest. In this way, in the first winding section, the vicinity of the first grounding point 302, which is a singular point, is kept away from the process container 203, and the other sections are brought closer to d1 which is a predetermined distance from the process container 203. Accordingly, while reducing the bias of the plasma density of the ICP formed in the process chamber 201, it is possible to minimize the decrease in the plasma density and suppress the decrease in the production efficiency of reaction species.

Further, the coil separation distance at the second grounding point 304 of the resonance coil 212 in one or more embodiments of the present disclosure is d1, and a coil separation distance in a second winding section, which is on the upper end side of the resonance coil 212 and is a section where the resonance coil 212 winds once along the outer periphery of the process container 203 in a direction from the second grounding point 304 toward the first grounding point 302, is constant as d1. As a result, in the vicinity of the second grounding point 304, an ICP having a higher plasma density than the ICP generated in the vicinity of the first grounding point 302 is generated, thereby improving the production efficiency of the reaction species of a reaction gas.

Further, the length of a section from the first grounding point 302 to the second grounding point 304 of the resonance coil 212 is n times or 1/n times (where n is a natural number) the wavelength of the high frequency supplied as high frequency power. Further, the resonance coil 212 is configured so that other sections of the resonance coil 212 are not arranged between the first winding section of the resonance coil 212 and the outer periphery of the process container 203. That is, the first winding section including the first grounding point 302 of the resonance coil 212 and the second winding section including the second grounding point 304 of the resonance coil 212 are configured to be arranged so as not to overlap other sections in the horizontal direction. If the first winding section and the second winding section overlap other sections in the horizontal direction, a section near the grounding point moves away from the process container 203, making it difficult to generate an ICP.

Further, the length of the first winding section of the resonance coil 212 is set to be longer than a length to the nearest position, which is less than a predetermined ratio with respect to the amplitude at the first grounding point 302, from the first grounding point 302 where the amplitude of the standing wave of the current flowing through the resonance coil 212 becomes maximum. That is, in the first winding section of the resonance coil 212, there is a position where the amplitude of the standing wave of the current flowing through the resonance coil 212 is less than the predetermined ratio with respect to the amplitude at the first grounding point 302. Here, since the plasma density tends to be lower in a section where the amplitude of the standing wave of the current is smaller, a position where the amplitude of the standing wave of the current is less than a predetermined ratio with respect to the amplitude at the first grounding point 302 is present in the first winding section, which makes it easy to cause a bias in the plasma density with the first grounding point 302 as a singular point. Therefore, by using the resonance coil 212 according to the present disclosure, it is possible to remarkably improve the bias of the plasma density. For example, 80% is exemplified as a predetermined ratio at which the bias of the plasma density with the first grounding point 302 as a singular point is likely to occur. If the predetermined ratio exceeds 80%, the distribution of the plasma density of ICP in the first winding section becomes substantially uniform, making it difficult to obtain the effect of improving the uniformity by the disclosed technique. Therefore, it is preferable that the predetermined ratio at which the effect of improving the uniformity by the disclosed technique can be sufficiently obtained is 80% or less.

Further, the length of the first winding section of the resonance coil 212 is set to be longer than a length from the first grounding point 302 up to a first position where the amplitude of the standing wave of the current flowing through the resonance coil 212 is minimized (that is, a first position where the amplitude of the standing wave of a voltage is maximized). As described above, when there is a position in the first winding section of the resonance coil 212 where the amplitude of the standing wave of the current is minimized, a point where the amplitude of the standing wave of the current at the first grounding point 302 becomes the maximum and a point where the amplitude thereof becomes the minimum are present in the first winding section, making it easy to cause the bias of the plasma density. Therefore, by using the resonance coil 212 according to the present disclosure, it is possible to remarkably improve the bias of the plasma density.

As described above, also in the resonance coil 212 in one or more embodiments of the present disclosure, the power feeding point is provided on the line of the resonance coil 212, and the high frequency power is supplied from the high frequency power supply 273 to form a standing wave of current and voltage having a length of, for example, one wavelength of the high frequency power supplied on the line of the resonance coil 212. Therefore, the amplitude of the standing wave of the current becomes maximum at the first grounding point 302, the second grounding point 304, and the midpoint therebetween of the resonance coil 212. That is, the amplitude of the standing wave of the voltage becomes the minimum (ideally zero) at the first grounding point 302, the second grounding point 304, and the midpoint therebetween of the resonance coil 212, and the amplitude becomes the maximum at positions between the first grounding point 302 and the midpoint and between the second grounding point 304 and the midpoint. Further, the power feeding point is provided near the grounding point in order to lower the impedance of the resonance coil 212.

As described above, in one or more embodiments of the present disclosure, the coil winding diameter is set so that the coil separation distance at the first grounding point 302 arranged in the vicinity of the wafer 200 is the longest in the first winding section of the resonance coil 212. Further, the coil winding diameter is set so that the coil separation distance at the first grounding point 302 of the resonance coil 212 is the longest in the section between the first grounding point 302 and the second grounding point 304 of the resonance coil 212. In the embodiments, this maximum distance is d2. More specifically, in the embodiments, the coil winding diameter is set so that the coil separation distance at the first grounding point 302 of the resonance coil 212 is d2, which is longer than d1. In one or more embodiments of the present disclosure, the coil winding diameter is set so that the coil separation distance at the grounding point where the amplitude of the standing wave of the current becomes maximum is the maximum distance in the entire section of the resonance coil 212.

Here, the strength of the high frequency electromagnetic field formed by the resonance coil 212 is inversely proportional to a distance from the resonance coil 212. Therefore, by setting the coil separation distance at the first grounding point 302 to d2, which is longer than d1, the strength of the high frequency electromagnetic field affected by the amplitude of the current of the resonance coil 212 at the first grounding point 302 arranged in the vicinity of the wafer 200 is reduced.

Therefore, by setting the coil separation distance at the first grounding point 302 near the wafer 200, which is a substrate to be processed, to be the longest in the section between the first grounding point 302 and the second grounding point 304 of the resonance coil 212, the strength of the high frequency electromagnetic field formed in the vicinity of the first grounding point 302 is reduced. Therefore, it is possible to suppress the bias of the plasma density of the process gas generated in the circumferential direction of the resonance coil 212 by the high frequency electromagnetic field.

Further, since the second grounding point 304 is farther from the wafer 200, which is the substrate to be processed, than the first grounding point 302, the effect of the bias of the plasma density caused by the second grounding point 304 as a singular point on the in-plane uniformity of processing on the wafer 200 is relatively smaller than that of the first grounding point 302. Therefore, by setting the coil separation distance at the second grounding point 304, which is far from the wafer 200 and has a relatively small effect on the in-plane uniformity of the substrate processing, to be a distance (for example, d1) shorter than the coil separation distance d2 at the first grounding point 302, it is possible to maintain the production efficiency of the reaction species without causing a decrease in the plasma density due to the increase in the coil separation distance at the second grounding point 304. As a result, while reducing the bias of the plasma density in the circumferential direction due to the grounding point, it is possible to improve the in-plane uniformity of the wafer 200 while maintaining the plasma processing efficiency.

Further, the specific values of the coil separation distances d1 and d2 can be appropriately adjusted according to other conditions such as the magnitude of the high frequency power supplied to the resonance coil 212, the thickness of the resonance coil 212, the desired degree of uniformity of the plasma density (particularly in the circumferential direction of the upper container 210), etc.

(Control Part)

A controller 221 as a control part is configured to control the APC valve 242, the valve 243b, and the vacuum pump 246 via a signal line A, the susceptor-elevating mechanism 268 via a signal line B, a heater-power-adjusting mechanism 276 and the impedance variable mechanism 275 via a signal line C, the gate valve 244 via a signal line D, the RF sensor 272, the high frequency power supply 273, and the matching device 274 via a signal line E, and the MFCs 252a to 252c and the valves 253a to 253c and 243a via a signal line F.

As shown in FIG. 6, the controller 221, which is the control part (control means), is configured as a computer including a central processing unit (CPU) 221a, a random access memory (RAM) 221b, a memory 221c, and an I/O port 221d. The RAM 221b, the memory 221c, and the I/O port 221d are configured to be capable of exchanging data with the CPU 221a via an internal bus 221e. An input/output device 225 configured as, for example, a touch panel or a display, is connected to the controller 221.

The memory 221c is configured by, for example, a flash memory, a hard disk drive (HDD), or the like. A control program for controlling operations of a substrate processing apparatus, a process recipe in which sequences and conditions of substrate processing, which will be described later, are written, etc. are readably stored in the memory 221c. The process recipe functions as a program for causing the controller 221 to execute each sequence in a substrate-processing process, which will be described later, to obtain a predetermined result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 221b is configured as a memory area (work area) in which a program or data read by the CPU 221a is temporarily stored.

The I/O port 221d is connected to the MFCs 252a to 252c, the valves 253a to 253c, 243a, and 243b, the gate valve 244, the APC valve 242, the vacuum pump 246, the RF sensor 272, the high frequency power supply 273, the matching device 274, the susceptor-elevating mechanism 268, the impedance variable mechanism 275, the heater-power-adjusting mechanism 276, and the like.

The CPU 221a is configured to read and execute the control program from the memory 221c. The CPU 221a is also configured to read the process recipe from the memory 221c according to an input of an operation command from the input/output device 225. Then, the CPU 221a is configured to control the operation of adjusting the opening degree of the APC valve 242, the opening/closing operation of the valve 243b, the actuating and stopping of the vacuum pump 246 via the I/O port 221d and the signal line A, the elevating operation of the susceptor-elevating mechanism 268 via the signal line B, the operation of adjusting the amount of power supplied to the heater 217b (the temperature adjusting operation) by the heater-power-adjusting mechanism 276 and the operation of adjusting the impedance by the impedance variable mechanism 275 via the signal line C, the opening/closing operation of the gate valve 244 via the signal line D, the operations of the RF sensor 272, the matching device 274, and the high frequency power supply 273 via the signal line E, the operation of adjusting flow rates of various kinds of gases by the MFCs 252a to 252c and the opening/closing operation of the valves 253a to 253c and 243a via the signal line F, and the like, according to contents of the read process recipe.

The controller 221 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 226. The memory 221c and the external memory 226 are configured as a non-transitory computer-readable recording medium. Hereinafter, the memory 221c and the external memory 226 may be generally and simply referred to as a "recording medium." When the term "recording medium" is used herein, it may indicate a case of including the memory 221c only, a case of including the external memory 226 only, or a case of including both the memory 221c and the external memory 226. The program may be provided to the computer by using a communication means such as the Internet or a dedicated line, instead of using the external memory 226.

(2) Substrate-Processing Process

Next, a substrate-processing process according to one or more embodiments of the present disclosure will be described mainly with reference to FIG. 7. FIG. 7 is a flow chart showing a substrate-processing process according to one or more embodiments of the present disclosure. The substrate-processing process according to one or more embodiments of the present disclosure, which is one of processes of manufacturing a semiconductor device such as a flash memory, is carried out by the above-described substrate processing apparatus 100. In the following description, the operations of various parts constituting the substrate processing apparatus 100 are controlled by the controller 221.

Although not shown, a trench including an uneven portion having a high aspect ratio is formed in advance on the surface of a wafer 200 to be processed in the substrate-processing process according to one or more embodiments of the present disclosure. In one or more embodiments of the present disclosure, for example, a silicon (Si) layer exposed on the inner wall of the trench is subjected to an oxidation process as a process using plasma.

(Substrate-Loading Step S110)

First, the wafer 200 is loaded into the process chamber 201. Specifically, the susceptor-elevating mechanism 268 lowers the susceptor 217 to a transfer position of the wafer 200 to penetrate the wafer push-up pins 266 through the through-holes 217a of the susceptor 217. As a result, the wafer push-up pins 266 protrude by a predetermined height from the surface of the susceptor 217.

Subsequently, the gate valve 244 is opened, and the wafer 200 is loaded into the process chamber 201 from a vacuum transfer chamber adjacent to the process chamber 201 by using a wafer transfer mechanism (not shown). The loaded wafer 200 is supported in a horizontal posture on the wafer push-up pins 266 protruded from the surface of the susceptor 217. After the wafer 200 is loaded into the process chamber 201, the wafer transfer mechanism is retracted to the outside of the process chamber 201, and the gate valve 244 is closed to seal the interior of the process chamber 201. Then, the susceptor-elevating mechanism 268 raises the susceptor 217 so that the wafer 200 is supported on the upper surface of the susceptor 217.

(Temperature Rise/Vacuum-Exhaust Step S120)

Subsequently, the temperature of the wafer 200 loaded into the process chamber 201 is raised. The heater 217b is preheated, and by holding the wafer 200 on the susceptor 217 in which the heater 217b is embedded, the wafer 200 is heated to a predetermined value in a range of, for example, 150 to 750 degrees C. Further, while the temperature of the wafer 200 is raised, the interior of the process chamber 201 is vacuum-exhausted by the vacuum pump 246 via the gas exhaust pipe 231 to set the internal pressure of the process chamber 201 to a predetermined value. The vacuum pump 246 keeps operated at least until a substrate-unloading step S160 to be described later is completed.

(Reaction Gas Supply Step S130)

Next, the supply of an oxygen-containing gas and a hydrogen-containing gas as the reaction gas is started. Specifically, the valves 253a and 253b are opened, and the oxygen-containing gas and the hydrogen-containing gas are started to be supplied into the process chamber 201 while their flow rates are controlled by the MFC 252a and the MFC 252b, respectively. At this time, the flow rate of the oxygen-containing gas is set to a predetermined value in a range of, for example, 20 to 2,000 sccm. Further, the flow rate of the hydrogen-containing gas is set to a predetermined value in a range of, for example, 20 to 1,000 sccm.

Further, the opening degree of the APC valve 242 is adjusted to control the exhaust of the interior of the process chamber 201 so that the internal pressure of the process chamber 201 becomes a predetermined pressure in a range of, for example, 1 to 250 Pa. In this way, while appropriately exhausting the interior of the process chamber 201, the supply of the oxygen-containing gas and the hydrogen-containing gas is continued until a plasma-processing step S140 to be described later is completed.

Examples of the oxygen-containing gas may include an oxygen ($O_2$) gas, a nitrous oxide ($N_2O$) gas, a nitric oxide (NO) gas, a nitrogen dioxide ($NO_2$) gas, an ozone ($O_3$) gas, water vapor ($H_2O$ gas), a carbon monoxide (CO) gas, a carbon dioxide ($CO_2$) gas, and the like. One or more of these gases can be used as the oxygen-containing gas.

Further, examples of the hydrogen-containing gas may include a hydrogen ($H_2$) gas, a deuterium ($D_2$) gas, a $H_2O$ gas, an ammonia ($NH_3$) gas, and the like. One or more of these gases can be used as the hydrogen-containing gas. When the $H_2O$ gas is used as the oxygen-containing gas, it is preferable to use a gas other than the $H_2O$ gas, as the hydrogen-containing gas, and when the $H_2O$ gas is used as the hydrogen-containing gas, it is preferable to use a gas other than the $H_2O$ gas, as the oxygen-containing gas.

Examples of the inert gas may include a nitrogen ($N_2$) gas and, in addition, a rare gas such as an argon (Ar) gas, a helium (He) gas, a neon (Ne) gas, or a xenon (Xe) gas. One or more of these gases can be used as the inert gas.

(Plasma-Processing Step S140)

When the internal pressure of the process chamber 201 is stabilized, the application of the high frequency power to the resonance coil 212 from the high frequency power supply 273 via the RF sensor 272 is started.

As a result, a high frequency electromagnetic field is formed in the plasma generation space into which the oxygen-containing gas and the hydrogen-containing gas are supplied, and donut-shaped ICP with the highest plasma density is excited at a height position corresponding to the electrical midpoint of the resonance coil 212 in the plasma generation space by this electromagnetic field. Further, as described above, the ICP adjusted so that the distribution of plasma density in the inner peripheral direction of the process container 203 is closer to uniformity by adjusting the coil separation distance is excited at the height position of the lower end of the resonance coil 212. Further, the ICP is also excited at the height position of the upper end of the resonance coil 212, but in one or more embodiments of the present disclosure, no adjustment is made to the plasma density distribution in the inner peripheral direction of the process container 203 by adjusting the coil separation distance, unlikely the lower end side. The oxygen-containing gas and the hydrogen-containing gas in the plasma state are dissociated to generate reactive species such as oxygen-containing oxygen radicals (oxygen-active species) or oxygen ions and hydrogen-containing hydrogen radicals (hydrogen-active species) or hydrogen ions.

Radicals and unaccelerated ions generated by inductive plasma are uniformly supplied into the trench of the wafer 200 held on the susceptor 217 in the substrate-processing space. The supplied radicals and ions react uniformly with the side wall to modify the surface layer (for example, a Si layer) into an oxide layer (for example, a Si oxide layer) with good step coverage.

After that, with the lapse of a predetermined processing time, for example, 10 to 300 seconds, the output of the power from the high frequency power supply 273 is stopped to stop the plasma discharge in the process chamber 201. Further, the valve 253a and the valve 253b are closed to stop the supply of the oxygen-containing gas and the hydrogen-containing gas into the process chamber 201. From the above, the plasma-processing step S140 is completed.

(Vacuum-Exhaust Step S150)

When the supply of the oxygen-containing gas and the hydrogen-containing gas is stopped, the interior of the process chamber 201 is vacuum-exhausted through the gas exhaust pipe 231. As a result, the oxygen-containing gas and the hydrogen-containing gas in the process chamber 201, an exhaust gas generated by the reaction of these gases, and the like are exhausted to the outside of the process chamber 201. After that, the opening degree of the APC valve 242 is adjusted to adjust the internal pressure of the process chamber 201 to the same pressure as the vacuum transfer chamber (the unloading destination of the wafer 200, not shown) adjacent to the process chamber 201.

(Substrate-Unloading Step S160)

When the interior of the process chamber 201 reaches a predetermined pressure, the susceptor 217 is lowered to the transfer position of the wafer 200, and the wafer 200 is supported on the wafer push-up pins 266. Then, the gate valve 244 is opened, and the wafer 200 is unloaded to the outside of the process chamber 201 by using the wafer transfer mechanism.

From the above, the substrate-processing process according to one or more embodiments of the present disclosure is completed.

(3) Modifications

The resonance coil 212 in the above-described embodiments can be modified as in modifications shown below. Unless stated otherwise, each modification has the same configuration as in the above-described embodiments, and explanation thereof will not be repeated.

(First Modification)

Figure 8A:
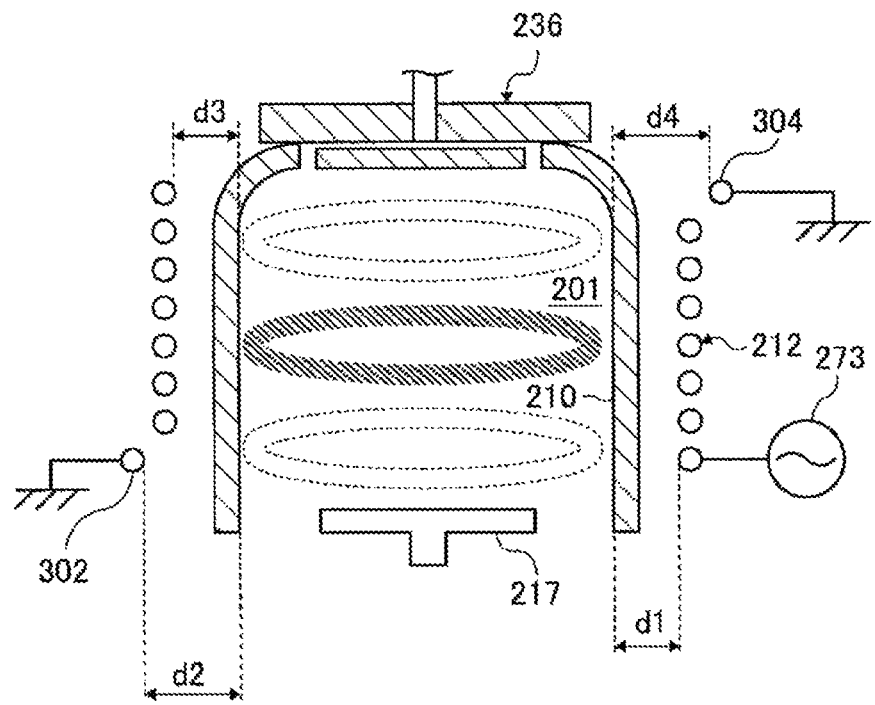
FIG. 8A is a view showing a state inside a process furnace when a process gas is plasma-excited by using a modification of the resonance coil suitably used in the embodiments of the present disclosure.
Figure 8B:
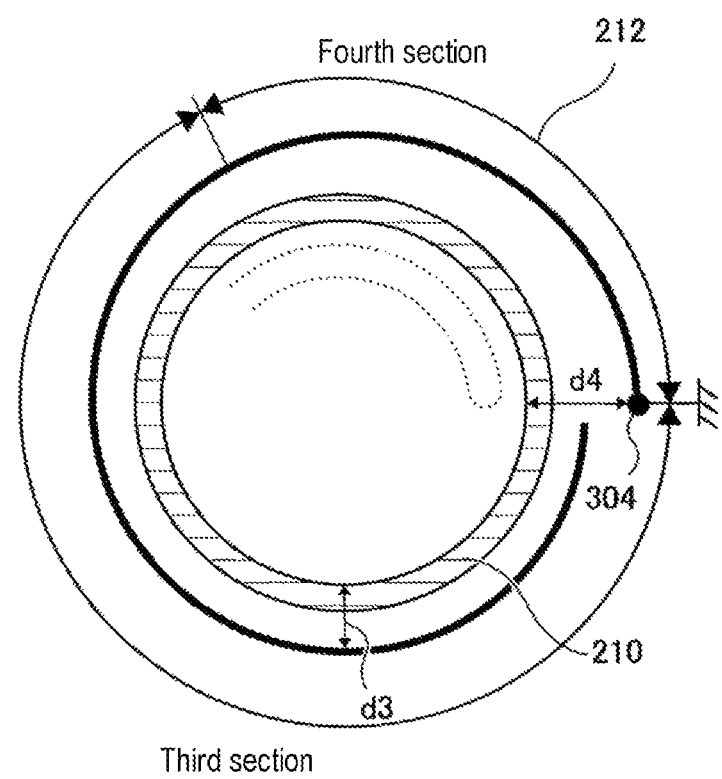
FIG. 8B is a horizontal sectional view at the upper end of the resonance coil of FIG. 8A.

In a first modification, as shown in FIGS. 8A and 8B, in addition to the first grounding point 302 on the lower end side of the resonance coil 212, the coil separation distance at the second grounding point 304 on the upper end side of the resonance coil 212 is made longer than the coil separation distance d1 at the midpoint of the resonance coil 212.

Specifically, the resonance coil 212 has a second winding section, which is a section where the resonance coil 212 winds once along the outer periphery of the process container 203 in a direction from the second grounding point 304 toward the first grounding point 302. The second winding section is composed of a third section in which the coil separation distance is constant at d3, and a fourth section continuous with the third section, including the second grounding point 304, in which the coil separation distance is longer than d3. Further, the resonance coil 212 is configured such that the coil separation distance in the fourth section including the second grounding point 304 in the second winding section is longer than the coil separation distance d3 in the third section. Further, the length of the fourth section is set to be shorter than half of the second winding section.

As shown in FIGS. 8A and 8B, the coil separation distance d4 at the second grounding point 304 in the fourth section is set to be longer than the coil separation distance d3 in the third section. Further, the resonance coil 212 is configured so that the coil separation distance d4 at the second grounding point 304 of the coil separation distance in the second winding section is the longest. In this way, similarly to the first winding section, in the second winding section, the vicinity of the second grounding point 304, which is a singular point, is kept away from the process container 203, and the other sections are brought closer to d3 which is a predetermined distance from the process container 203. Accordingly, while reducing the bias of the plasma density of the ICP formed in the process chamber 201, it is possible to minimize the decrease in the plasma density and suppress the decrease in the production efficiency of reaction species.

In this modification, as the grounding points of the resonance coil 212, the coil separation distance at the first grounding point 302 of the resonance coil 212 where the amplitude of the standing wave of a current becomes maximum and the coil separation distance at the second grounding point 304 of the resonance coil 212 where the amplitude of the standing wave of the current becomes maximum are set to be longer than the coil separation distance at other sections of the resonance coil 212. As a result, even when the amplitude of the standing wave of the current becomes maximum at the grounding points of both ends of the first grounding point 302 and the second grounding point 304 of the resonance coil 212, according to this modification, it is possible to reduce the bias of the plasma density, thereby improving the in-plane uniformity of the wafer 200.

That is, in addition to the first grounding point 302 of the resonance coil 212, by setting the coil separation distance at the second grounding point 304 to be longer than those at the other sections between the first grounding point 302 and the second grounding point 304, the strength of the high frequency electromagnetic field formed in the vicinity of the first grounding point 302 and the second grounding point 304 is reduced.

Further, the coil separation distance d4 at the second grounding point 304 may be equal to or different from the coil separation distance d2 at the first grounding point 302 in the second section. In this modification, the coil separation distance d2 at the first grounding point 302 is different from the coil separation distance d4 at the second grounding point 304. Specifically, the coil separation distance d2 at the first grounding point 302 is set to be longer than the coil separation distance d4 at the second grounding point 304. d3 and d1 may be the same distance.

As described above, since the second grounding point 304 is farther from the wafer 200, which is the substrate to be processed, than the first grounding point 302, the effect of the bias of the plasma density caused by the second grounding point 304 as a singular point on the in-plane uniformity of processing on the wafer 200 is relatively smaller than that of the first grounding point 302. Therefore, by setting the coil separation distance d4 at the second grounding point 304, which is far from the wafer 200 and has a relatively small effect on the in-plane uniformity of the substrate processing, to be shorter than the coil separation distance d2 at the first grounding point 302, it is possible to maintain the production efficiency of the reaction species while minimizing a decrease in the plasma density due to the increase in the coil separation distance at the second grounding point 304. As a result, while reducing the bias of the plasma density in the circumferential direction due to the grounding point, it is possible to improve the in-plane uniformity of the wafer 200 while maintaining the plasma processing efficiency.

Further, by setting the coil separation distance d2 at the first grounding point 302 to be different from the coil separation distance d4 at the second grounding point 304, the distribution of plasma density in the first winding section and the distribution of plasma density in the second winding section can be adjusted individually, so that the film thickness distribution of a film formed on the wafer 200 can be controlled.

Here, as described above, the plasma generated in the vicinity of the midpoint of the resonance coil 212 tends to be superior in the density uniformity in the circumferential direction of the upper container 210 over the plasmas generated on the upper end side and the lower end side of the resonance coil 212. Therefore, in this modification, the coil separation distances at the grounding points on the upper end side and the lower end side of the resonance coil 212 are increased to reduce the strength of the high frequency electromagnetic field generated from these positions in the upper container 210, thereby relatively increasing the ratio of the plasma with excellent uniformity generated in the vicinity of the midpoint of the resonance coil 212, which contributes to the substrate processing. Therefore, from the viewpoint of improving the uniformity of the plasma density in the circumferential direction of the upper container 210, this modification is generally preferable over the above-described embodiments. However, from the viewpoint of emphasizing the production efficiency of the reaction species, the above-described embodiments used for the generation of the reaction species without lowering the strength of the high frequency electromagnetic field in the upper container 210 generated from the grounding point on the upper end side of the resonance coil 212 are preferable.

(Second Modification)

Figure 9A:
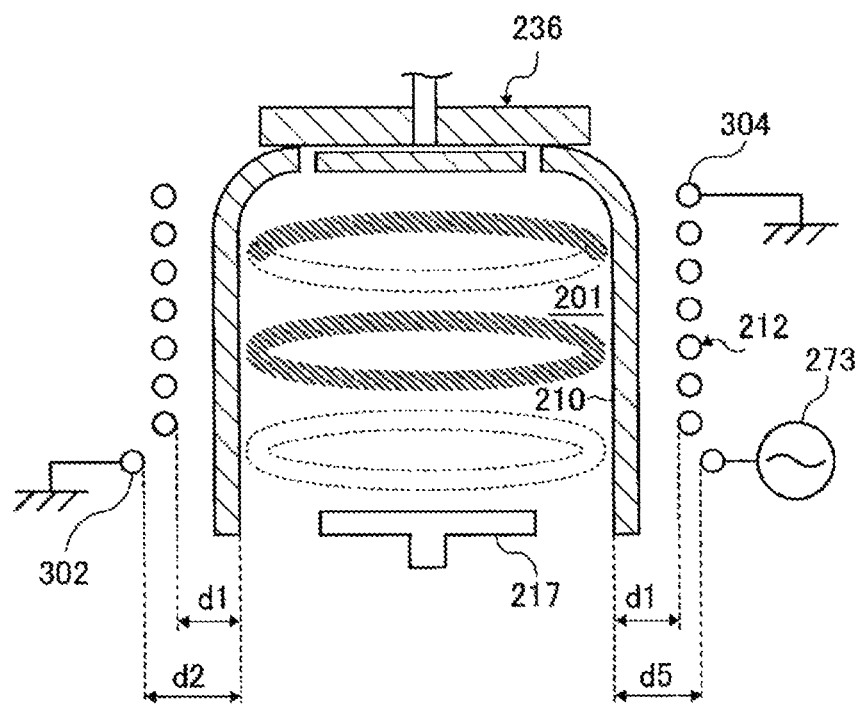
FIG. 9A is a diagram showing a state inside a process furnace when a process gas is plasma-excited by using another modification of the resonance coil suitably used in the embodiments of the present disclosure.
Figure 9B:
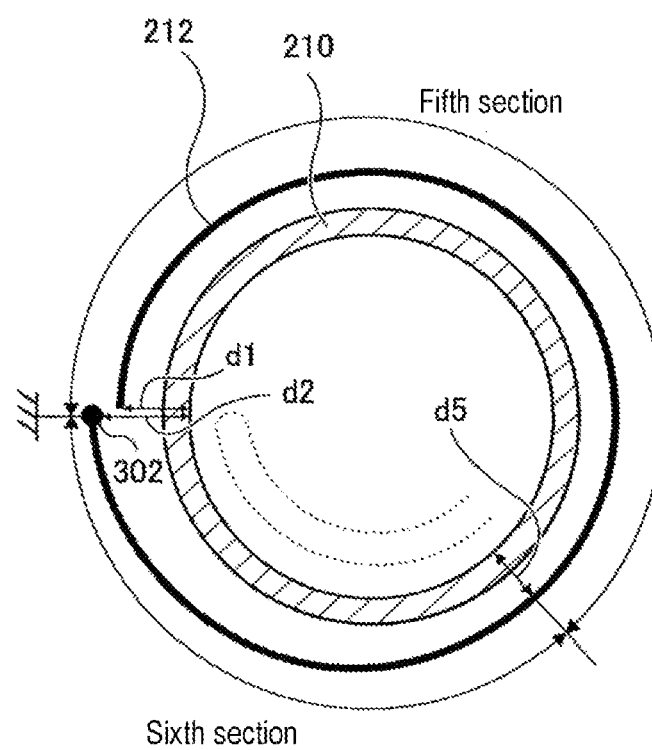
FIG. 9B is a horizontal sectional view at the lower end of the resonance coil of FIG. 9A.

In a second modification, as shown in FIGS. 9A and 9B, the coil separation distance in the first winding section on the lower end side of the resonance coil 212 is set to be longer than the coil separation distance d1 at the midpoint of the resonance coil 212, and the coil separation distance in the second winding section including the second grounding point 304 on the upper end side of the resonance coil 212 is set to be the same d1 as the coil separation distance at the midpoint of the resonance coil 212. Further, as shown in FIG. 9B, the coil separation distance at the start point on the upper end side of the first winding section may be, for example, d1 or longer than d1.

In this modification, the first winding section is composed of a sixth section including the first grounding point 302 and a fifth section which is a section other than the sixth section. In the fifth section, the coil separation distance is set to continuously increase from the coil separation distance d1 to a coil separation distance d5 in the direction from the second grounding point 304 toward the first grounding point 302, and in the sixth section, the coil separation distance is set to further continuously increase from d5, which is longer than the coil separation distance d1, to d2 in the direction toward the first grounding point 302. The coil separation distance d2 at the first grounding point 302 is set to be the longest in the coil separation distance in the first winding section. Further, the resonance coil 212 is configured such that the increase rate of the coil separation distance in the direction from the second grounding point 304 toward the first grounding point 302 in the sixth section is larger than the increase rate in the fifth section. That is, the resonance coil 212 is configured such that the amount of increase of the coil separation distance in the sixth section, which is a section in the vicinity of the first grounding point 302, changes to be larger than the amount of increase of the coil separation distance in the fifth section.

By configuring the resonance coil 212 in this way, as in the above-described embodiments, the coil separation distance on the lower end side is lengthened to decrease the strength of the high frequency electromagnetic field, which is generated near the grounding point in the vicinity of the wafer 200, in the upper container 210, thereby improving the uniformity of the plasma density in the circumferential direction of the upper container 210.

(Third Modification)

Figure 10:
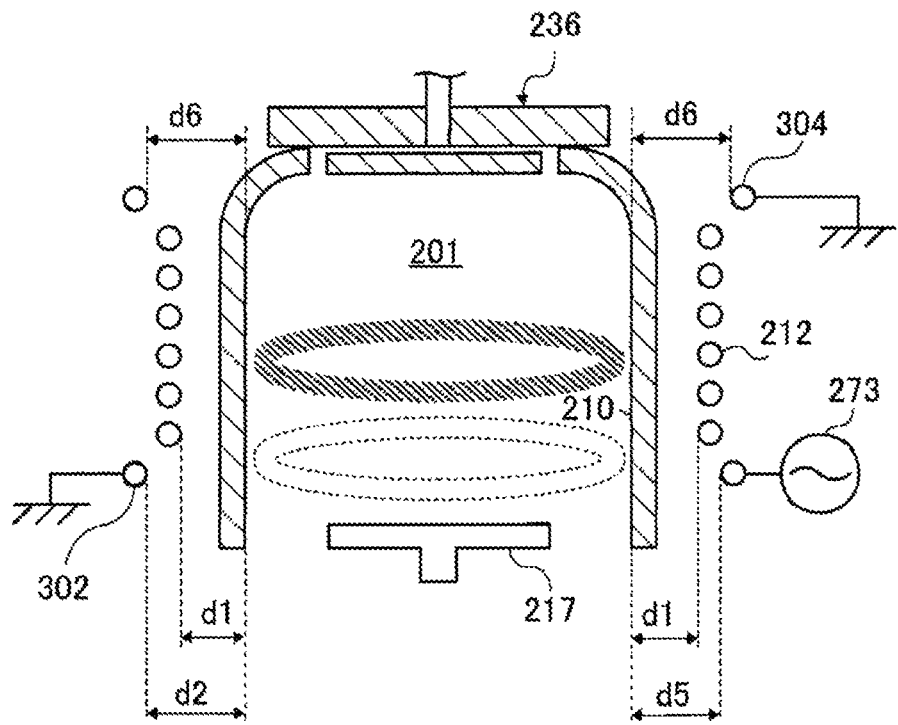
FIG. 10 is a diagram showing a state inside a process furnace when a process gas is plasma-excited by using another modification of the resonance coil suitably used in the embodiments of the present disclosure.

In a third modification, as shown in FIG. 10, in addition to the coil separation distance in the first winding section including the first grounding point 302 of the resonance coil 212 in the above-described second modification, a coil separation distance in the entire second winding section including the grounding point 304 of the resonance coil 212 is set to be longer than d1 which is the coil separation distance in other sections between the first grounding point 302 and the second grounding point 304 of the resonance coil 212 and is the coil separation distance at the midpoint of the resonance coil 212. Further, in this modification, the coil separation distance in the second winding section including the second grounding point 304 of the resonance coil 212 is d6 and is set to be constant. In this modification, the coil separation distance of the resonance coil 212 in both the entire first winding section and the entire second winding section is set to be longer than the coil separation distance d1 which is the coil separation distance in other sections between the first grounding point 302 and the second grounding point 304 of the resonance coil 212 and is the coil separation distance at the midpoint of the resonance coil 212. With such setting, while maintaining the plasma density (that is, the production efficiency of the reaction species) generated by the other sections between the first grounding point 302 and the second grounding point 304 of the resonance coil 212, it is possible to more reliably suppress the bias of the plasma density, which is caused by the first grounding point 302 and the second grounding point 304 as singular points, than in the above-described embodiments and first and second modifications.

Further, it is preferable that the coil separation distance d6 is longer than at least d1 and longer than the coil separation distance d4 in the second modification. It is more preferable that the coil separation distance d6 is longer than d4 and is long enough that ICP is not substantially produced by the high frequency electromagnetic field generated from the second winding section. As a result, it is possible to further reliably suppress the bias of the plasma density caused by the second grounding point 304 as a singular point.

In this modification, both the coil separation distance in the first winding section and the coil separation distance in the second winding section of the resonance coil 212 have been described as being longer than the other sections, but the present disclosure is limited thereto. Instead, the coil separation distance of either the first winding section or the second winding section may be set to be longer than that of the other sections. That is, the coil separation distance of the resonance coil 212 in at least one selected from the group of the entire first winding section and the entire second winding section may be set to be longer than d1 which is the coil separation distance in other sections between the first grounding point 302 and the second grounding point 304 of the resonance coil 212.

Further, in this modification, the configuration in which the coil separation distance in the first winding section is set as in the second modification and the coil separation distance in the second winding section is constant at d6 has been described, but the present disclosure is not limited thereto. Instead, also for the first winding section, as in the second winding section, the coil separation distance in the entire first winding section may be set to be constant at a distance (for example, d6) longer than d1.

(Fourth Modification)

Figure 11:
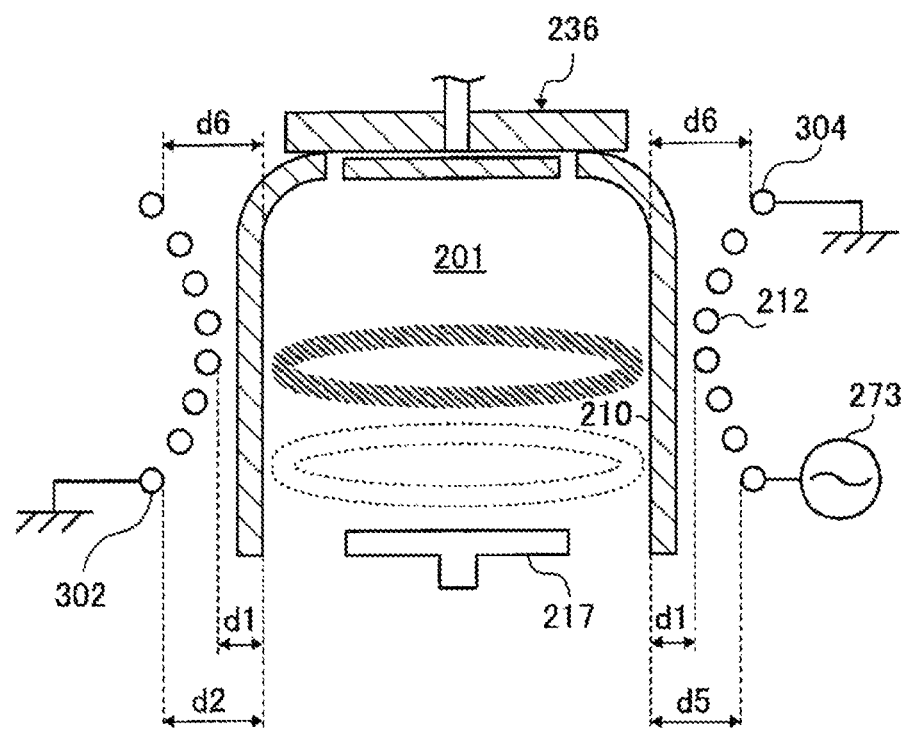
FIG. 11 is a diagram showing a state inside a process furnace when a process gas is plasma-excited by using another modification of the resonance coil suitably used in the embodiments of the present disclosure.

In a fourth modification, as shown in FIG. 11, the coil separation distances in the first winding section and the second winding section are set to be longer than the coli separation distance d1 at the midpoint of the resonance coil 212, which is the coil separation distance in the other sections between the first grounding point 302 and the second grounding point 304, and further, the coil separation distance is set to be gradually shortened from the first winding section and the second winding section toward the midpoint of the resonance coil 212, so that the coil separation distance is set to be the shortest at the midpoint between the first grounding point 302 and the second grounding point 304. Further, the coil separation distance may be set to be gradually shortened from either one of the first winding section and the second winding section toward the midpoint of the resonance coil 212. The coil separation distance in the first winding section and the second winding section can be the same as, for example, the coil separation distance in the third modification.

By configuring the resonance coil 212 in this way, it is possible to selectively generate ICP at the midpoint of the resonance coil 212, which is particularly excellent in the uniformity of plasma density and the generation efficiency of reaction species, and to maximize the coil separation distance at the first grounding point 302 and the second grounding point 304 which are singular points to deteriorate the uniformity of plasma density, thereby further improving the in-plane uniformity of the wafer 200 in plasma processing. Further, a standing wave of voltage is generated in each of a section between the first winding section and the midpoint of the resonance coil 212 and a section between the second winding section and the midpoint of the resonance coil 212. Plasma (hereinafter referred to as CCP) of a CCP (Capacitively Coupled Plasma) component formed in the vicinity of a section where the amplitude of this standing wave of voltage is large may generate sputtering on the inner wall surface of the process container 203. However, by configuring the resonance coil 212 so that the coil separation distance in the section where the amplitude of this standing wave of voltage is large as in this modification is longer than d1, it is possible to suppress the generation of CCP and also suppress the sputtering due to CCP.

<Other Embodiments>

Although various typical embodiments and modifications of the present disclosure have been described above, the present disclosure is not limited to these embodiments and modifications, but may be used in proper combination.

For example, in the above embodiments, the example in which the upper end and the lower end of the resonance coil 212 are grounded to be the first grounding point 302 and the second grounding point 304, respectively, has been described, but without being limited thereto, the grounding point may not be provided at the upper end or the lower end of the resonance coil 212. That is, the resonance coil 212 may include sections other than the section between the first grounding point 302 and the second grounding point 304. In this case, it is preferable that at least one selected from the group of the upper end and the lower end belonging to the sections other than the section between the first grounding point 302 and the second grounding point 304 is further grounded. By grounding the end portions belonging to the sections other than the section between the first grounding point 302 and the second grounding point 304 in this way, it is possible to suppress the influence of changes in current and voltage in a section from the first grounding point 302 or the second grounding point 304 up to these end portions on the plasma density distribution, thereby making it easy to control the plasma density distribution.

Further, in the above embodiments, the example in which the oxidation process is performed on the substrate surface by using plasma has been described, besides, the present disclosure can also be applied to a nitridation process using a nitrogen-containing gas as the process gas. Further, the present disclosure can be applied not only to the nitridation process and the oxidation process but also to any technique for performing a process to a substrate by using plasma. For example, the present disclosure can be applied to a modification process and a doping process performed by using plasma for a film formed on a substrate surface, a reduction process for an oxide film, an etching process for the film, an ashing process of a resist, and the like.

Although the present disclosure has been described in detail with the specific embodiments and modifications, the present disclosure is not limited to such embodiments and modifications, and it is apparent to those skilled in the art that it is possible to take various other embodiments within the scope of the present disclosure.

Hereinafter, Examples will be described.

Example 1

Sample 1 and Sample 2, which are bare wafers (Si substrates), were prepared, and an oxidation process shown below was performed to each of Sample 1 and Sample 2.

Sample 1 is one made by forming an oxide film on the bare wafer by performing the oxidation process on the surface of the bare wafer according to the above-described substrate-processing sequence of FIG. 7 by using the resonance coil 212 shown in FIGS. 8A and 8B in the above-described substrate processing apparatus 100. That is, in Sample 1, high frequency power is supplied to the resonance coil 212, and an oxygen-containing gas and a hydrogen-containing gas are plasma-excited to perform the oxidation process. The process conditions were set to predetermined conditions within a range of process conditions described in the above-described embodiments.

Sample 2 is one made by forming an oxide film on the bare wafer by performing the oxidation process on the surface of the bare wafer according to the above-described substrate-processing sequence of FIG. 7 by using the resonance coil 412 shown in FIGS. 3A and 3B in the above-described substrate processing apparatus 100. That is, in Sample 2, high frequency power is supplied to the resonance coil 412, and the same oxidation process as described above is performed. The process conditions were set to predetermined conditions within a range of process conditions described in the above-described embodiments, and were the same process conditions as in Sample 1.

FIG. 12 is a diagram showing a comparison in the average film thickness and the in-plane uniformity between the oxide films formed on Sample 1 and Sample 2, respectively. Here, the in-plane uniformity is a numerical value (%) calculated by dividing a difference between the maximum film thickness and the minimum film thickness by the average film thickness.

It is confirmed from FIG. 12 that the oxide film formed on the wafer of Sample 1 is improved in the in-plane uniformity as compared with the oxide film formed on the wafer of Sample 2, although a difference in the average film thickness between the oxide film formed on the wafer of Sample 1 and the oxide film formed on the wafer of Sample 2 is small as about 0.1 nm. That is, it is confirmed that the in-plane uniformity of the wafer is improved by using the resonance coil 212 of the present embodiments.

According to the present disclosure in some embodiments, it is possible to improve the in-plane uniformity of substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process container in which a process gas is plasma-excited;
a gas supply system configured to supply the process gas into the process container; and
a coil provided with a section between a first grounding point and a second grounding point of the coil so as to be spirally wound a plurality of times along an outer periphery of the process container, the coil being configured to supply high frequency power,
wherein the coil is configured so that a coil separation distance, which is a distance from an inner periphery of the coil to an inner periphery of the process container, in a partial section of a first winding section, which is a section where the coil winds once along the outer periphery of the process container in a direction from the first grounding point toward the second grounding point, is longer than a coil separation distance in another partial section of the first winding section continuous with the partial section of the first winding section,
wherein the partial section of the first winding section includes the first grounding point, and
wherein the coil is configured such that other sections of the coil except for the first winding section are not arranged between the first winding section and the outer periphery of the process container.

2. The substrate processing apparatus of claim 1, wherein the coil is configured so that a coil separation distance at the first grounding point is the longest in the first winding section.

3. The substrate processing apparatus of claim 1, wherein the coil is configured so that a coil separation distance at the first grounding point is the longest in the section between the first grounding point and the second grounding point.

4. The substrate processing apparatus of claim 1, wherein a length of the section between the first grounding point and the second grounding point of the coil is n times or 1/n times (where n is a natural number) a wavelength of a high frequency signal supplied as the high frequency power.

5. The substrate processing apparatus of claim 1, wherein the first winding section of the coil is composed of a first section in which a coil separation distance is a distance d, and a second section including the first grounding point and having a coil separation distance longer than the distance d.

6. The substrate processing apparatus of claim 5, wherein a length of the second section is shorter than half of the first winding section.

7. The substrate processing apparatus of claim 1, further comprising:
   a substrate-mounting table on which a substrate is mounted,
      wherein the substrate-mounting table is provided below the coil in the process container, and
      wherein the first grounding point is provided below the second grounding point.

8. The substrate processing apparatus of claim 1, wherein the coil is configured so that a coil separation distance in a partial section of a second winding section, which is a section where the coil winds once along the outer periphery of the process container in a direction from the second grounding point toward the first grounding point, is longer than a coil separation distance in another partial section of the second winding section continuous with the partial section of the second winding section, and
   wherein the partial section of the second winding section includes the second grounding point.

9. The substrate processing apparatus of claim 8, wherein the second winding section of the coil is composed of a third section in which a coil separation distance is a distance d3, and a fourth section including the second grounding point and having a coil separation distance longer than the distance d3.

10. The substrate processing apparatus of claim 8, wherein a coil separation distance at the second grounding point is different from a coil separation distance at the first grounding point.

11. The substrate processing apparatus of claim 10, wherein the coil separation distance at the first grounding point is longer than the coil separation distance at the second grounding point.

12. The substrate processing apparatus of claim 1, wherein the coil is configured so that a coil separation distance in a second winding section, which is a section where the coil winds once along the outer periphery of the process container in a direction from the second grounding point toward the first grounding point, is constant.

13. The substrate processing apparatus of claim 1, wherein a length of the first winding section of the coil is longer than a length to the first grounding point from a position where an amplitude of a standing wave of a current flowing through the coil is less than 80% of an amplitude at the first grounding point.

14. The substrate processing apparatus of claim 1, wherein a length of the first winding section of the coil is longer than a length to the first grounding point from a position where an amplitude of a standing wave of a current flowing through the coil is minimized.

15. The substrate processing apparatus of claim 1, wherein in the first winding section, the coil is configured so that a coil separation distance increases in a direction from the second grounding point toward the first grounding point, and is configured so that a rate of increase of the coil separation distance in the direction from the second grounding point toward the first grounding point is larger in the partial section of the first winding section than in the another partial section of the first winding section.

16. The substrate processing apparatus of claim 1, wherein the coil is configured so that a coil separation distance in at least one selected from the group of an entire range of the first winding section and an entire range of a second winding section, which is a section where the coil winds once along the outer periphery of the process container in a direction from the second grounding point toward the first grounding point, is longer than a coil separation distance in the other section in the section between the first grounding point and the second grounding point of the coil.

17. The substrate processing apparatus of claim 16, wherein the coil is configured so that a coil separation distance is the shortest at a midpoint between the first grounding point and the second grounding point, and is configured so that the coil separation distance is shortened from at least one selected from the group of the first winding section and the second winding section of the coil toward the midpoint.

18. A method of manufacturing a semiconductor device in a substrate processing apparatus including:
   a process container in which a process gas is plasma-excited; and
   a coil provided with a section between a first grounding point and a second grounding point of the coil so as to be spirally wound a plurality of times along an outer periphery of the process container, the coil being configured so that a coil separation distance, which is a distance from an inner periphery of the coil to an inner periphery of the process container, in a partial section of a first winding section, which is a section where the coil winds once along the outer periphery of the process container in a direction from the first grounding point toward the second grounding point, is longer than a coil separation distance in another partial section of the first winding section continuous with the partial section of the first winding section, the partial section of the first winding section including the first grounding point, and the coil is configured such that other sections of the coil except for the first winding section are not arranged between the first winding section and the outer periphery of the process container, the method comprising:
   (a) loading a substrate into the process container;
   (b) supplying the process gas into the process container;
   (c) plasma-exciting the process gas supplied into the process container by supplying high frequency power to the coil; and
   (d) processing the substrate by supplying reaction species generated from the plasma-excited process gas to the substrate.

19. A non-transitory computer-readable recording medium storing a program that causes, by a computer, a substrate processing apparatus to perform a process, the substrate processing apparatus including:

a process container in which a process gas is plasma-excited; and a coil provided with a section between a first grounding point and a second grounding point of the coil so as to be spirally wound a plurality of times along an outer periphery of the process container, the coil being configured so that a coil separation distance, which is a distance from an inner periphery of the coil to an inner periphery of the process container, in a partial section of a first winding section, which is a section where the coil winds once along the outer periphery of the process container in a direction from the first grounding point toward the second grounding point, is longer than a coil separation distance in another partial section of the first winding section continuous with the partial section of the first winding section, the partial section of the first winding section including the first grounding point, and the coil is configured such that other sections of the coil except for the first winding section are not arranged between the first winding section and the outer periphery of the process container, and the process comprising:

(a) loading a substrate into the process container;
(b) supplying the process gas into the process container;
(c) plasma-exciting the process gas supplied into the process container by supplying high frequency power to the coil; and
(d) processing the substrate by supplying reaction species generated from the plasma-excited process gas to the substrate.

* * * * *